United States Patent
Yoda et al.

(10) Patent No.: US 7,709,098 B2
(45) Date of Patent: May 4, 2010

(54) MULTI-LAYERED THERMALLY CONDUCTIVE SHEET

(75) Inventors: Masaki Yoda, Sagamihara (JP); Yoshinao Yamazaki, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 635 days.

(21) Appl. No.: 11/568,237

(22) PCT Filed: May 17, 2005

(86) PCT No.: PCT/US2005/017283

§ 371 (c)(1), (2), (4) Date: Oct. 24, 2006

(87) PCT Pub. No.: WO2006/001943

PCT Pub. Date: Jan. 5, 2006

(65) Prior Publication Data

US 2007/0231552 A1    Oct. 4, 2007

(30) Foreign Application Priority Data

Jun. 14, 2004    (JP) .............................. 2004-175854

(51) Int. Cl.
*B32B 27/32* (2006.01)
*B32B 27/08* (2006.01)
(52) U.S. Cl. .................. 428/515; 428/220; 428/332
(58) Field of Classification Search ........................ None
See application file for complete search history.

(56) References Cited

U.S. PATENT DOCUMENTS

| 4,894,259 A | 1/1990 | Kuller |
| 5,766,740 A | 6/1998 | Olson |
| 5,840,783 A | 11/1998 | Momchilovich et al. |
| 6,126,865 A | 10/2000 | Haak et al. |

FOREIGN PATENT DOCUMENTS

| JP | 11-74667 | 3/1999 |
| JP | 11-145351 | 5/1999 |
| JP | 2003-160775 | 6/2003 |
| JP | 2003-238760 | 8/2003 |
| WO | WO 03/093336 A1 | 11/2003 |
| WO | WO 2005/082999 A2 | 9/2005 |

OTHER PUBLICATIONS

ASTM D 6294-98, "Standard Test Method for Corrosion Resistance of Ferrous Metal Fastener Assemblies Used in Roofing and Waterproofing", pp. 441-444 (2003).

*Primary Examiner*—Sheeba Ahmed
(74) *Attorney, Agent, or Firm*—James A. Baker

(57) ABSTRACT

There is provided a multi-layered thermally conductive sheet having superior thermal conductivity and flame retardancy as well as superior handleability and adhesion even without using any of a halogen-containing flame retardant, red phosphorous, and silicone resin. The sheet includes a first acrylic thermally conductive sheet layer, and a second acrylic thermally conductive sheet layer disposed on one or both surfaces of the first layer. The first layer has an Asker C hardness of 60 or more and is obtained by curing a composition containing a metal hydrate at a content of 10% by volume or more, and the second layer has an Asker C hardness of 50 or less and is obtained by curing a composition containing a metal hydrate at a content of 5% by volume or more. The first layer has half or less thickness with respect to thickness of the whole sheet.

5 Claims, No Drawings

MULTI-LAYERED THERMALLY CONDUCTIVE SHEET

TECHNICAL FIELD

The present invention relates to a multi-layered thermally conductive sheet. More specifically, the present invention relates to a multi-layered thermally conductive sheet having superior thermal conductivity and flame retardancy as well as superior handleability and adhesion with an object on which the sheet is disposed.

BACKGROUND OF THE INVENTION

A thermally conductive sheet is used in such a condition that it is arranged to be in contact with a heat-generating body such as electronics. Therefore, a thermally conductive sheet is required to have superior thermal conductivity and high flame retardancy. The flame retardancy is desired to correspond to "V-0" level in UL Flameproof Test Standard UL-94 (Underwriters Laboratories, Inc. Standard No. 94) "flammability test of plastic materials for devices and electronic parts (hereinbelow referred to as "UL-94 flammability test")."

On the other hand, with recent miniaturization and high integration of electronics, requirement for a thermally conductive thin sheet having a thickness of below 1 mm has been increasing. As a binder constituting a thermally conductive sheet, a silicone resin has recently been used. However, there is an indication that siloxane gas generated from the silicone resin causes a contact failure in electronics. Therefore, it is preferred to use a non-silicone resin.

However, it has been difficult for a conventionally-known thermally conductive sheet containing a non-silicone resin as a binder to have a flame retardancy corresponding to V-0 in UL-94 flammability test when the sheet has a thickness of less than 1 mm. In addition, when a thermally conductive sheet is made so thin, the thermally conductive sheet has relatively low strength. Therefore, it has been difficult to simultaneously achieve superior adhesion with electronics, or the like, and handleability of the thermally conductive sheet. Incidentally, it is possible to blend a halogen-type flame retardant (retardant containing halogen) or a red phosphorous with the binder to enhance flame retardancy while the thermally conductive sheet is kept thin (refer to JP-A-2003-238760). However, there is a request of avoiding such a halogen-containing flame retardant by the industrial world in consideration of influence on the environment. In addition, use of a red phosphorous is not always preferable in view of safety.

Related prior arts are disclosed in, for example, JP-B-3283454 and JP-A-63-118392. In addition, a radiating sheet which comprises an elastic substrate and an adhesive layer, each containing a filler having high thermal conductivity is disclosed in, for example, JP-A-11-74667. However, since the adhesive layer constituting the radiation sheet is unvulcanized, it is prone to cause a flame drip in a perpendicular flaming test such as UL-94 flammability test. Therefore, it has been difficult to achieve flame retardancy corresponding to V-0 in UL-94 flammability test when the radiating sheet is made to have a thickness of below 1 mm. Further, the unvulcanized adhesive layer sometimes causes adhesive transfer when the sheet is peeled off from the object since the adhesive layer is unvulcanized. In addition, the radiation sheet disclosed in JP-A-11-74667 has insufficient thermal conductivity because of a low coefficient of thermal conductivity thereof.

In addition, an adhesive tape which comprises an elastic substrate and an adhesive layer, each containing a filler having thermal conductivity and electrical insulation, is disclosed in, for example, JP-B-2003-160775. However, the adhesive tape has a problem of not showing sufficient flame retardancy in UL-94 flammability test. In addition, the adhesive tape disclosed in the document has insufficient thermal conductivity because of a low coefficient of thermal conductivity thereof.

SUMMARY OF THE INVENTION

The present invention has been made in consideration of the conventional problems, aiming to provide a multi-layered thermally conductive sheet which can have superior thermal conductivity and flame retardancy as well as superior handleability and adhesion even without using any of a halogen-containing flame retardant, red phosphorous, and silicone resin.

The present inventors made an energetic study to address the above object and, as a result, found out that the above problems can be solved by laminating at least two acrylic thermally conductive sheet layers which contain a metal hydrate at a predetermined content and which have different crosslinking density.

That is, according to the present invention, there is provided a multi-layered thermally conductive sheet as described below:

A multi-layered thermally conductive sheet comprising:
a first acrylic thermally conductive sheet layer, and
a second acrylic thermally conductive sheet layer disposed on one or both surfaces of the first acrylic thermally conductive sheet layer;
the first acrylic thermally conductive sheet layer having an Asker C hardness of 60 or more,
the first acrylic thermally conductive sheet layer being obtained by curing a first composition containing 10% by volume or more of a metal hydrate,
the second acrylic thermally conductive sheet layer having an Asker C hardness of 50 or less,
the second acrylic thermally conductive sheet layer being obtained by curing a second composition containing 5% by volume or more of a metal hydrate, and
the first acrylic thermally conductive sheet layer having half or less thickness with respect to thickness of the whole sheet.

In the above multi-layered thermally conductive sheet, it is preferable that a first acrylic thermally conductive sheet layer is obtained by curing a first composition containing: 100 parts by weight of a monofunctional (meth)acrylic monomer, 0.1 to 5 parts by weight of a polyfunctional (meth)acrylic monomer and/or 0.5 to 20 parts by weight of a triazine skeleton-containing compound copolymerizable with the monofunctional (meth)acrylic monomer and the polyfunctional (meth)acrylic monomer, and 150 parts by weight or more of a metal hydrate, and a second acrylic thermally conductive sheet layer is obtained by curing a second composition containing. 100 parts by weight of the monofunctional (meth)acrylic monomer, 0.05 to 1.5 parts by weight of the polyfunctional (meth) acrylic monomer and/or 0.1 to 5 parts by weight of the triazine skeleton-containing compound, and 50 parts by weight or more of the metal hydrate.

In the multi-layered thermally conductive sheets of the present invention, it is preferable to have a thermal conductivity of 1 W/(m·K) or more.

In the multi-layered thermally conductive sheets of the present invention, it is preferable to have a flame retardancy corresponding to V-0 in the flammability test based on UL Flameproof Test Standard UL-94 (Underwriters Laboratories, Inc. Standard No. 94).

In the multi-layered thermally conductive sheets of the present invention, it is preferable to have a whole thickness of 1 mm or less.

The multi-layered thermally conductive sheet is provided with a first acrylic thermally conductive sheet layer and a second acrylic thermally conductive sheet layer disposed on one or both surfaces of the first acrylic thermally conductive sheet layer. The first acrylic thermally conductive sheet layer is obtained by curing a first composition containing 10% by volume or more of a metal hydrate and has an Asker C hardness of 60 or more. The second acrylic thermally conductive sheet layer is obtained by curing a second composition containing 5% by volume or more of a metal hydrate and has an Asker C hardness of 50 or less. In addition, the first acrylic thermally conductive sheet layer has half or less thickness with respect to thickness of the whole sheet. Therefore, the first multi-layered thermally conductive sheet can have superior thermal conductivity and flame retardancy as well as superior handleability and adhesion even without substantially using any of a halogen-containing flame retardant, red phosphorous, and silicone resin.

DESCRIPTION OF THE PREFERRED EMBODIMENT

The present invention is hereinbelow described with regard to preferred embodiments of the present invention. However, the present invention should not be limited to the following embodiments and may suitably be modified or improved on the basis of those skilled in the art within the range not deviating from the gist of the present invention. Incidentally, hereinbelow, "(meth)acrylic" means "acrylic or methacrylic," and "(meth)acrylic monomer" means an acrylic monomer such as acrylic acid or acrylic ester, or a methacrylic monomer such as methacrylic acid or methacrylic ester. In addition, "(meth)acrylic polymer" means "polymer obtained by polymerizing monomers including acrylic monomers or methacrylic monomers."

The multi-layered thermally conductive sheet, which is the first embodiment of the present invention, is a so-called lamination-type thermally conductive sheet provided with the first acrylic thermally conductive sheet layer and the second acrylic thermally conductive sheet layer disposed on one or both surfaces of the first acrylic thermally conductive sheet layer. The first acrylic thermally conductive sheet layer constituting the first multi-layered thermally conductive sheet of the first embodiment is a layer obtained by curing the first composition containing 10% by volume or more of a metal hydrate and has an Asker C hardness of 60 or more. The second acrylic thermally conductive sheet layer is a layer obtained by curing the second composition containing 5% by volume or more of a metal hydrate and has an Asker C hardness of 50 or less. That is, the multi-layered thermally conductive sheet of the present embodiment has a laminated structure of two kinds of layers each containing a metal hydrate at a predetermined content and having different Asker C hardness. By employing such a lamination-type structure, the multi-layered thermally conductive sheet of the present embodiment hardly causes a flame drip even in a perpendicular flaming test such as UL-94 flammability test described below and shows superior flame retardancy corresponding to V-0 and superior thermal conductivity. Further, the first multi-layered sheet thermally conductive sheet of the present embodiment is not constituted only by the first acrylic thermally conductive sheet layer having high hardness, but has a laminated structure with the second multi-layered thermally conductive sheet, which is more flexible than the first acrylic thermally conductive sheet layer. Therefore, the first multi-layered thermally conductive sheet has high flexibility as a whole with sufficient flame retardancy and superior in handleability and adhesion with an object on which the sheet is disposed. Incidentally, in the case that a plurality of the second acrylic thermally conductive sheet layers are used, each layer may have an Asker C hardness of 50 or less, and each of the second acrylic thermally conductive sheet layers may have the same or different Asker C hardness.

The content of the metal hydrate contained in the first composition constituting the first acrylic thermally conductive sheet layer of the multi-layered conductive sheet of the present embodiment is 10% by volume or more, preferably 15% by volume or more, more preferably 20% by volume or more. When the content is less than 10% by volume, the resultant multi-layered thermally conductive sheet sometimes has poor flame retardancy. Incidentally, though there is no particular upper limit of the content of a metal hydrate contained in the first composition, the content may be 80% by volume or less from the viewpoint of practical manufacturability. On the other hand, the content of a metal hydrate contained in the second composition constituting the first acrylic thermally conductive sheet layer of the multi-layered conductive sheet of the present embodiment is 5% by volume or more, preferably 8% by volume or more. When the content is less than 5% by volume, the resultant multi-layered thermally conductive sheet sometimes has poor flame retardancy. Incidentally, though there is no particular upper limit regarding the content of a metal hydrate contained in the second composition, the content may be 80% by volume or less from the viewpoint of practical manufacturability.

In the multi-layered thermally conductive sheet of the present embodiment, it is preferred that the first acrylic thermally conductive sheet layer has an Asker C hardness of 65 or more, and that the second acrylic thermally conductive sheet layer has an Asker C hardness of 45 or less, and it is further preferred that the first acrylic thermally conductive sheet layer has an Asker C hardness of 70 or more, and that the second acrylic thermally conductive sheet layer has an Asker C hardness of 40 or less. When the first acrylic thermally conductive sheet layer has an Asker C hardness of below 60, the multi-layered thermally conductive sheet tends to have insufficient flame retardancy. In addition, when the second acrylic thermally conductive sheet layer has an Asker C hardness of above 50, the multi-layered thermally conductive sheet tends to have deteriorated adhesion with an object on which the sheet is disposed. Incidentally, though there is no particular upper limit regarding the Asker C hardness of the first acrylic thermally conductive sheet layer, the Asker C hardness may be 100 or less from the viewpoint of practical manufacturability. In addition, though there is no particular lower limit of the Asker C hardness of the second acrylic thermally conductive sheet layer, the Asker C hardness may be 10 or more from the viewpoint of practical manufacturability.

The multi-layered thermally conductive sheet of the present embodiment is a so-called lamination-type thermally conductive sheet provided with the first acrylic thermally conductive sheet layer and the second acrylic thermally conductive sheet layer disposed on one or both surfaces of the first acrylic thermally conductive sheet layer. The first acrylic thermally conductive sheet layer constituting the multi-layered thermally conductive sheet of the present embodiment preferably has a crosslinking density higher than that of the second acrylic thermally conductive sheet layer. Incidentally, in the case that a plurality of the second acrylic thermally conductive sheet layers are used, the first acrylic thermally conductive sheet layer may have a crosslinking density higher than those of the second acrylic thermally conductive sheet layers, and each of the second acrylic thermally conductive sheet layers may have the same or different composition.

The multi-layered thermally conductive sheet of the present embodiment has a laminated structure comprising two kinds of layers having different crosslinking densities, that is, hardness. By employing such a lamination-type structure, the multi-layered thermally conductive sheet of the present embodiment hardly cause a flame drip even in a perpendicular flaming test such as UL-94 flammability test described below and shows superior flame retardancy corresponding to V-0 and superior thermal conductivity. Further, the second multi-layered thermally conductive sheet of the present embodiment is not constituted only by the first acrylic thermally conductive sheet layer having high crosslinking density and high hardness, but has a laminated structure with the second multi-layered thermally conductive sheet, which has a lower crosslinking density and a higher flexibility in comparison with the first acrylic thermally conductive sheet layer. Therefore, the second multi-layered thermally conductive sheet has high flexibility as a whole with sufficient flame retardancy and superior handleability and adhesion with an object on which the sheet is disposed.

In addition, in the multi-layered thermally conductive sheet of the present embodiment, the first acrylic thermally conductive sheet layer has half or less thickness with respect to thickness of the whole sheet (the first acrylic thermally conductive sheet layer plus the second acrylic thermally conductive sheet layer). When the thickness of the first acrylic thermally conductive sheet layer is above half of the thickness of the whole sheet, the multi-layered thermally conductive sheet is too hard as a whole, which is not preferable because adhesion with an object is deteriorated though flame retardancy is enhanced. Incidentally, in the present embodiment, thickness of the first acrylic thermally conductive sheet layer is preferably 1/20 to 1/2, further preferably 1/10 to 1/3, with respect to the thickness of the whole sheet in consideration of a balance of the properties such as thermal conductivity, flame retardancy, handleability, and adhesion with the object.

Hereinbelow is given a detailed description of each of the materials constituting the first acrylic thermally conductive sheet layer and the second acrylic thermally conductive sheet layer of the multi-layered thermally conductive sheet of an embodiment of the present invention.

1) Monofunctional (meth)acrylic Monomer

Monofunctional (meth)acrylic monomer used for the multi-layered thermally conductive sheet of the present embodiment is not particularly limited and may be a monomer used in order to form a general (meth)acrylic polymer. Incidentally, only one kind or a mixture of two or more kinds of monofunctional (meth)acrylic monomers may be used. Preferable examples are monofunctional (meth)acrylic monomers having alkyl groups having 20 or less carbons, including ethyl(meth)acrylate, butyl(meth)acrylate, hexyl (meth)acrylate, 2-ethylhexyl(meth)acrylate, octyl(meth) acrylate, isooctyl(meth)acrylate, decyl(meth)acrylate, dodecyl(meth)acrylate, acrylic acid, methacrylic acid.

2) Polyfunctional (meth)acrylic Monomer

Polyfunctional (meth)acrylic monomer used for the multi-layered thermally conductive sheet of the present embodiment is a compound having two or more functional groups selected from the group consisting of acryloxy group and methacryloxy group. Incidentally, only one kind or a mixture of two or more kinds of monofunctional (meth)acrylic monomers may be used. Preferable examples includes: di(meth) acrylates such as 1,6-hexanediol diacrylate, 1,4-butanediol diacrylate, ethylene glycol diacrylate, diethylene glycol diacrylate, tetraethylene glycol diacrylate, tripropylene glycol diacrylate, neopentyle glycol diacrylate, 1,4-butanediol dimethacrylate, poly(butanediol) diacrylate, tetraethylene glycol dimethacrylate, 1,3-butylene glycol diacrylate, triethylene glycol diacrylate, triisopropylene glycol diacrylate, polyethylene glycol diacrylate, and bisphenol A dimethacrylate; tri(meth)acrylates such as trimethylol propane triacrylate, trimethylol propane trimethacrylate, pentaerythritol monohydroxy triacrylate, and trimethylol propane triethoxy triacrylate; tetraacrylates such as pentaerythritol tetraacrylate, and di-trimethylol propane tetraacrylate; and pentaacrylate such as dipentaerythritol (monohydroxy) pentaacrylate.

The content of the polyfunctional (meth)acrylic monomer in the first composition constituting the first acrylic thermally conductive sheet layer of the multi-layered thermally conductive sheet of the present embodiment is 0.1 to 5 parts by mass, preferably 1 to 4 parts by mass, more preferably 1 to 3 parts by mass, with respect to 100 parts by weight of monofunctional (meth)acrylic monomer in the first composition. When the content is less than 0.1 part by mass, the resultant multi-layered thermally conductive sheet sometimes has insufficient flame retardancy. When the content is more than 5 parts by mass, the first acrylic thermally conductive sheet layer becomes brittle, which sometimes cause cracks, or the like.

Meanwhile, the content of the polyfunctional (meth) acrylic monomer in the second composition constituting the second acrylic thermally conductive sheet layer of the multi-layered thermally conductive sheet of the present embodiment is 0.05 to 1.5 parts by mass, preferably 0.1 to 0.45 part by mass, more preferably 0.15 to 0.4 part by mass, with respect to 100 parts by weight of monofunctional (meth) acrylic monomer in the second composition. When the content is less than 0.05 part by mass, the second acrylic thermally conductive sheet layer has deteriorated hardness, and the resultant multi-layered thermally conductive sheet is prone to have insufficient flame retardancy with deteriorated handleability. When the content is more than 1.5 parts by mass, the second acrylic thermally conductive sheet layer has excessive hardness, and the resultant multi-layered thermally conductive sheet sometimes has deteriorated adhesion with an object.

3) Triazine Skeleton-Containing Compound

A triazine skeleton-containing compound used for the multi-layered thermally conductive sheet of the present embodiment is a compound copolymerizable with (meth) acrylic monomer, for example, triallyl isocyanurate and trimethallyl isocyanurate. The content of the triazine skeleton-containing compound in the first composition constituting the first acrylic thermally conductive sheet layer of the multi-layered thermally conductive sheet of the present embodiment is 0.5 to 20 parts by mass, preferably 3 to 15 parts by mass, more preferably 4 to 12 parts by mass, with respect to 100 parts by weight of monofunctional (meth)acrylic monomer of the first composition. When the content is less than 0.5 part by mass, the resultant multi-layered thermally conductive sheet sometimes has insufficient flame retardancy. When the content is more than 20 parts by mass, the first acrylic thermally conductive sheet layer becomes brittle, which sometimes cause cracks, or the like.

Meanwhile, the content of the triazine skeleton-containing compound in the second composition constituting the second acrylic thermally conductive sheet layer of the multi-layered thermally conductive sheet of the present embodiment is 0.1 to 5 parts by mass, preferably 1.8 parts by weight or less, more preferably 1.6 parts by weight or less, with respect to 100 parts by weight of monofunctional (meth)acrylic monomer of the second composition. When the content is more than 5 parts by mass, the second acrylic thermally conductive sheet layer has excessive hardness, and the resultant multi-layered thermally conductive sheet sometimes has deteriorated adhesion with an object. When the content is less than 0.1 part by mass, the second acrylic thermally conductive sheet layer has deteriorated hardness, and the resultant multi-layered thermally conductive sheet is prone to have insufficient flame retardancy with deteriorated handleability.

4) Metal Hydrate

Examples of a metal hydrate used for the multi-layered thermally conductive sheet of the present embodiment includes aluminum hydroxide, magnesium hydroxide, barium hydroxide, calcium hydroxide, dawsonite, hydrotalcite, zinc borate, calcium aluminate, and zirconium oxide hydrate. Only one kind or a mixture of two or more kinds of these metal hydrates may be used. Among these, aluminum hydroxide and magnesium hydroxide are preferable from the viewpoint of the effect on flame retardancy. Generally, these metal hydrates are added to the material in the form of particles. It is preferred that a metal hydrate containing a group of relatively large particles having the average particle diameter of 5 to 50 micrometers and a group of relatively small particles having the average particle diameter of below 5 micrometers in combination be used so as to increase the amount of the metal hydrate to be added to the material. It is further preferred to use a metal hydrate subjected to a surface treatment with silane, titanate, fatty acid, or the like, so as to enhance strength (for example, tensile/breaking strength) of the resultant multi-layered thermally conductive sheet.

Further, it is preferred to add a thermally conductive filler in addition to a metal hydrate so as to enhance thermal conductivity of the resultant multi-layered thermally conductive sheet. Examples of suitable fillers include one or more kinds selected from the group consisting of metallic oxides, metallic nitrides, and metallic carbides. Examples of the metallic oxide include aluminum oxide, magnesium oxide, beryllium oxide, titanium oxide, zirconium oxide, and zinc oxide. Examples of the metallic nitrides include boron nitride, aluminum nitride, and silicon nitride. Examples of the metallic carbides include boron carbide, aluminum carbide, and silicon carbide. Among these, further preferable are aluminum oxide, magnesium oxide, boron nitride, aluminum nitride, and silicon carbide from the viewpoint of thermal conductivity and mechanical properties. It is preferred to use a combination of a filler of relatively large particles having the average particle diameter of 10 to 500 micrometers and a filler of relatively small particles having the average particle diameter of below 10 micrometers, so as to increase the amount of the fillers to be added to the material.

The content of the metal hydrate in the first composition constituting the first acrylic thermally conductive sheet layer of the multi-layered thermally conductive sheet of the present embodiment is preferably 150 parts by weight or more, more preferably 250 parts by weight or more, particularly preferably 350 parts by weight or more, with respect to 100 parts by weight of monofunctional (meth)acrylic monomer of the first composition. When the content is less than 150 parts by mass, sometimes flame retardancy of the resultant multi-layered thermally conductive sheet is hardly enhanced. Incidentally, though there is no particular upper limit regarding the content of the metal hydrate, the content may be 700 parts by weight or less from the viewpoint of practical manufacturability.

Meanwhile, the content of the metal hydrate in the second composition constituting the second acrylic thermally conductive sheet layer of the multi-layered thermally conductive sheet of the present embodiment is preferably 50 parts by weight or more, more preferably 100 parts by weight or more, particularly preferably 150 parts by weight or more, with respect to 100 parts by weight of monofunctional (meth) acrylic monomer. When the content is less than 50 parts by mass, sometimes flame retardancy of the resultant multi-layered thermally conductive sheet is hardly enhanced. Incidentally, though there is no particular upper limit regarding the content of the metal hydrate, the content may be 700 parts by weight or less from the viewpoint of practical manufacturability.

5) Other Additives 5.1) Crosslinking Agent

It is also possible to use a suitable crosslinking agent with or in place of the aforementioned triazine skeleton-containing compound used for the multi-layered thermally conductive sheet of the present embodiment. By adjusting the kind, amount, etc., of the crosslinking agent to be used, crosslinking density of the first acrylic thermally conductive sheet layer and the second acrylic thermally conductive sheet layer as well as strength (i.e., tensile/breaking strength) of the resultant multi-layered thermally conductive sheet can be suitably adjusted.

For example, it is also possible to use a crosslinking agent capable of being activated by heat. Examples of the crosslinking agent includes: hexamethoxymethyl melamine (e.g., commercial name: Cymel 303, produced by American Cyanamide Company), tetramethoxymethyl urea (e.g., commercial name: Beetle 65, produced by American Cyanamide Company), and tetrabutoxymethyl urea (e.g., commercial name: Beetle 85, produced by American Cyanamide Company). Incidentally, only one kind or a combination of two or more kinds of these crosslinking agents may be used.

The content of the crosslinking agent in the first composition constituting the first acrylic thermally conductive sheet layer of the multi-layered thermally conductive sheet of the present embodiment is preferably 0.5 to 2.5 parts by weight with respect to 100 parts by weight of monofunctional (meth) acrylic monomer of the first composition. When the content is less than 0.5 part by mass, the resultant multi-layered thermally conductive sheet sometimes has insufficient flame retardancy. When the content is more than 0.5 part by mass, the resultant multi-layered thermally conductive sheet has lowered flexibility, and the first acrylic thermally conductive sheet layer becomes brittle, which sometimes cause cracks, or the like, therein.

Meanwhile, the content of the crosslinking agent in the second composition constituting the second acrylic thermally conductive sheet layer of the multi-layered thermally conductive sheet of the present embodiment is preferably 0.01 to 0.5 part by weight with respect to 100 parts by weight of monofunctional (meth)acrylic monomer of the second composition. When the content is lower than 0.01 part by mass, the second acrylic thermally conductive sheet layer has lowered hardness, and the resultant multi-layered thermally conductive sheet is prone to have insufficient flame retardancy with deteriorated handleability. When the content is more than 0.5 part by mass, the second acrylic thermally conductive sheet layer has excessive hardness, and the resultant multi-layered thermally conductive sheet sometimes has deteriorated adhesion with the object.

5.2) Other Additives

Various kinds of additives may be added to the materials constituting the first and the second acrylic thermally conductive sheet layers of the multi-layered thermally conductive sheet of the present embodiment as long as the characteristics of the multi-layered thermally conductive sheet of the present invention are not spoiled. Examples of the additive include: tackifiers, antioxidants, chain-transfer agents, plasticizers, flame retardants, flame retarding auxiliaries, precipitation inhibitors, thickeners, thixotropy agents such as silica ultra fine powder, surfactants, antifoamers, colorants, electrically conductive particles, antistatic agents, and surface treatments agents. Incidentally, only one kind or a combination of two or more kinds of these additives may be used.

When a flame retardant is added to the composition, it is preferred to use a flame retardant which is substantially free from halogen (hereinbelow referred to as "halogen-free flame retardant"). Examples of the halogen-free flame retardant include: organic phosphorus compounds, expansible graphite, poly(phenylene ether), and triazine skeleton-containing compounds (including the aforementioned triazine skeleton-containing compounds). Among these, organic phosphorous compounds are most preferable from the viewpoint of exhibition of flame retardant effect. Incidentally, only one kind or a combination of two or more kinds of these flame retardants may be used.

The organic phosphorous compound may be a copolymerizable or uncopolymerizable with the monofunctional (meth)acrylic monomer and the polyfunctional (meth)acrylic monomer. Examples of organic phosphorous compound copolymerizable with these monomers include phosphate ester-containing (meth)acrylic monomers shown by the following general formula (1).

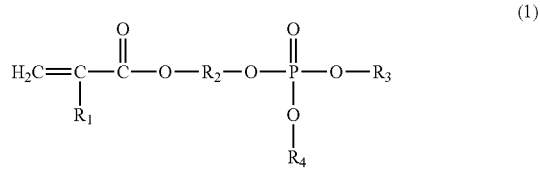

(1)

(wherein, $R_1$ represents hydrogen or a methyl group, $R_2$ represents an alkylene group, and $R_3$ and $R_4$ represent an alkyl group and an aryl group, respectively.)

Examples of the phosphate-containing (meth)acrylic monomer include: dimethyl-(meth)acryloyloxymethyl phosphate, diethyl-(meth)acryloyloxymethyl phosphate, diphenyl-(meth)acryloyloxymethyl phosphate, dimethyl-2-(meth)acryloyloxyethyl phosphate, diethyl-2-(meth)acryloyloxyethyl phosphate, diphenyl-2-(meth)acryloyloxyethyl phosphate, dimethyl-3-(meth)acryloyloxypropyl phosphate, diethyl-3-(meth)acryloyloxypropyl phosphate, and diphenyl-3-(meth)acryloyloxypropyl phosphate. These phosphate-containing (meth)acrylic monomers may be used singly or in combination of two or more kinds.

The content of the phosphate-containing (meth)acrylic monomer in the first composition constituting the first acrylic thermally conductive sheet layer of the multi-layered thermally conductive sheet of the present embodiment is preferably 10 to 50 parts by mass, more preferably 10 to 30 parts by mass, with respect to 100 parts by weight of monofunctional (meth)acrylic monomer of the first composition. When the content is less than 10 parts by mass, flame retardant effect is sometimes deteriorated. When the content is more than 50 parts by mass, the resultant multi-layered thermally conductive sheet has lowered flexibility.

Meanwhile, the content of the phosphate-containing (meth)acrylic monomer in the second composition constituting the second acrylic thermally conductive sheet layer of the multi-layered thermally conductive sheet of the present embodiment is preferably 2 to 30 parts by mass, more preferably 5 to 15 parts by mass, with respect to 100 parts by weight of monofunctional (meth)acrylic monomer of the second composition. When the content is less than 2 parts by mass, flame retardant effect is sometimes deteriorated. When the content is more than 30 parts by mass, the resultant multi-layered thermally conductive sheet has lowered flexibility.

Examples of organic phosphorous compound uncopolymerizable with monofunctional (meth)acrylic monomers and polyfunctional (meth)acrylic monomers include: phosphate esters, aromatic condensed phosphates, and ammonium polyphosphates. Examples of the phosphate esters include: triphenyl phosphate, tricresyl phosphate, cresyldiphenyl phosphate, 2-ethylhexyldiphenyl phosphate, tri-n-butyl phosphate, trixylenyl phosphate, resorcinol bis(diphenyl phosphate), and bisphenol A bis(diphenyl phosphate). Examples of the ammonium polyphosphates include: ammonium polyphosphate, melamine modified ammonium polyphosphate, and coated ammonium polyphosphate. Incidentally, coated ammonium polyphosphate means ammonium polyphosphate which is resin-coated or micro-encapsulated to enhance water resisting property.

The content of the organic phosphate compound substantially uncopolymerizable with monofunctional (meth)acrylic monomer, or the like, in the first composition constituting the first acrylic thermally conductive sheet layer of the multi-layered thermally conductive sheet of the present embodiment is preferably 5 to 50 parts by mass, more preferably 10 to 30 parts by mass, with respect to 100 parts by weight of monofunctional (meth)acrylic monomer of the first composition. When the content is less than 5 parts by mass, flame retardant effect is sometimes deteriorated. When the content is more than 50 parts by mass, the resultant multi-layered thermally conductive sheet has lowered cohesion or sometimes shows a bleeding phenomenon.

Meanwhile, the content of the organic phosphate compound substantially uncopolymerizable with monofunctional (meth)acrylic monomer, or the like, in the second composition constituting the second acrylic thermally conductive sheet layer of the multi-layered thermally conductive sheet of the present embodiment is preferably 5 to 50 parts by mass, more preferably 10 to 30 parts by mass, with respect to 100 parts by weight of monofunctional (meth)acrylic monomer of the second composition. When the content is less than 5 parts by mass, flame retardant effect is sometimes deteriorated. When the content is more than 30 parts by mass, the resultant multi-layered thermally conductive sheet has lowered cohesion.

Next, description is given with regard to an embodiment of a method for manufacturing a multi-layered thermally conductive sheet of the present invention. A multi-layered thermally conductive sheet of the present invention can be manufactured by: applying the first and the second compositions constituting the first and the second acrylic thermally conductive sheet layers, respectively, on a surface of each suitable support such as a release liner; subjecting the compositions to calendering or press molding to obtain sheets of the compositions; hardening (polymerizing) the sheets of the compositions; peeling the sheets from the supports to give layers; and laminating the layers.

It is also possible to manufacture a multi-layered thermally conductive sheet of the present embodiment by: preparing the first acrylic thermally conductive sheet layer by forming the layer of the first composition according to the above manner; directly applying the second composition on one or both surfaces of the first acrylic thermally conductive sheet layer obtained; and hardening (polymerizing) the second composition. Further, a multi-layered thermally conductive sheet of the present embodiment may be manufactured by forming each of the first composition and the second composition in lamination, laminating the first and the second compositions by a so-called multi-layer coating method as disclosed in JP-A-63-118392, and simultaneously hardening (polymerizing) the first and the second compositions. Furthermore, micro grooves or a three-dimensional micro pattern may be formed on at least one surface of a multi-layered thermally conductive sheet of the present embodiment to have the surface from which gas can be easily removed.

Monofunctional (meth)acrylic monomers generally have low viscosity and in some cases have insufficient handleability. In such a case, a component of the metal hydrate, or the like, sometimes precipitates. It is preferred to increase viscosity by previous partial polymerization of monofunctional (meth)acrylic monomers contained in the first and the second composition for constituting the first and the second acrylic thermally conductive sheet layers, respectively, of the multi-layered thermally conductive sheet of the present embodiment. Partial polymerization can be performed in various manners, for example, thermal polymerization, ultraviolet polymerization, electron beam polymerization, gamma-ray polymerization, and ion-beam polymerization.

Incidentally, polymerization initiators such as photopolymerization initiators and thermal polymerization initiators may be added to the first and the second compositions to perform the above partial polymerization. Examples of thermal polymerization initiators include organic peroxide such as diacyl peroxides, peroxy ketals, ketone peroxides, hydro peroxides, dialkyl peroxides, peroxy esters, and peroxydicarbonates. More specific examples of the organic peroxide include: lauroyl peroxide, benzoyl peroxide, cyclohexanone peroxide, 1,1-bis(t-butylperoxy)-3,3,5-trimethylcyclohexane, and 5-butylhydro peroxide. Incidentally, a combination of persulfate and bisulfite can also be used.

Examples of photopolymerization initiators include: benzoin ethers such as benzoin ethyl ether and benzoin isopropyl ether; anisoin ethyl ether, anisoin isopropyl ether, Michler's ketone (4,4'-tetramethyldiaminobenzophenone); and substituted acetophenones such as 2,2-dimethoxy-2-phenylacetophenone (e.g., commercial name: KB-1 produced by Sartomer Co., Inc. and commercial name: Irgacure 651 produced by Ciba Specialty Chemicals K.K.), 2,2-diethoxyacetophenone. Other examples include: substituted α-ketols such as 2-methyl-2-hydroxypropiophenone, aromatic sulphonylchlorides such as 2-naphthalenesulphonylchloride, and photoactive oxime compounds such as 1-phenone-1,1-propanedion-2(o-ethoxycarbonyl) oxime. In addition, the above thermal polymerization initiators and photo polymerization initiators may be used in any combination.

No limitation is given to the content of the polymerization initiator used upon partial polymerization of monofunctional (meth)acrylic monomers. However, the content is generally 0.001 to 5 parts by weight with respect to 100 parts by weight of monofunctional (meth)acrylic monomers. Further, it is preferred to add chain-transfer agent selected from mercaptanes, disulfides, or α-methylstyrene dimer, or a combination thereof to the first and the second compositions upon partial polymerization so as to control molecular weight and content of polymers contained in partially polymerized polymers obtained by the partial polymerization. Generally, the content of the chain-transfer agent is preferably 0.01 to 1 parts by mass, more preferably 0.02 to 0.5 parts by mass, with respect to 100 parts by weight of monofunctional (meth)acrylic monomer.

When the first and second composition containing a monofunctional (meth)acrylic monomer, a metal hydrate, and any or both of a polyfunctional (meth)acrylic monomer and a triazine skeleton-containing compound copolymerizable with the monofunctional (meth)acrylic monomer and if present, the polyfunctional (meth)acrylic monomer; a partially polymerized polymer obtained by partially polymerizing the above monofunctional (meth)acrylic monomer and/or polymerization initiator are added to the first and the second composition as necessary. Polymerization can be performed in various manners, for example, thermal polymerization, ultraviolet polymerization, electron beam polymerization, gamma-ray polymerization, and ion-beam polymerization.

When the first and the second compositions are thermally polymerized, a suitable amount of the above thermal polymerization initiator is contained in the first and second compositions. When the first and the second compositions are photopolymerized, a suitable amount of the above photopolymerization initiator is contained in the first and second composition. However, when polymerization is conducted by the use of particle beam like electron beam polymerization, no polymerization initiator is required generally. Incidentally, thermal polymerization is performed by heating the first and the second compositions to 50 to 200° C.

When the first and the second compositions are subjected to ultraviolet polymerization, the first and the second acrylic thermally conductive sheet layers can be obtained by deaerating and mixing the material with a planetary mixer to obtain a mixture, forming the mixture in the shape of a sheet, and irradiating ultraviolet radiation. However, when a large amount of metal hydrate is used, transmission of ultraviolet radiation is sometimes limited. In such a case, thermal polymerization is preferably employed in place of ultraviolet polymerization. Incidentally, it is preferred to conduct polymerization under an inert gas atmosphere such as nitrogen gas atmosphere to suppress inhibition of polymerization by oxygen.

The multi-layered thermally conductive sheet of the present embodiment shows superior flame retardancy corresponding to V-0 in UL-94 flammability test even without using a halogen-containing flame retardant. In addition, the multi-layered thermally conductive sheet has enhanced flexibility because the amount of the flame retardant, which has been used for improving flame retardancy, can be reduced. Further, the multi-layered thermally conductive sheet has sufficiently excellent handleability and adhesion to an object on which the sheet is disposed without employing any silicone resin. In addition, the multi-layered thermally conductive sheet has a coefficient of thermal conductivity of preferably 1 W/(m·K) or more, more preferably 2 W/(m·K) or more, to sufficiently exhibit an effect of heat radiation. The value of a coefficient of thermal conductivity of the multi-layered thermally conductive sheet can suitably be set by adjusting, for example, the amount of filler to be contained in the composition. Incidentally, a method for measuring "coefficient of thermal conductivity" referred to in this specification is described later.

The multi-layered thermally conductive sheet of the present embodiment is disposed between a heat sink, a radiator, or the like, and electronic parts, particularly, semiconductor electronic parts such as a power transistor, a graphic integrated circuit, a chip set, a memory set, and central processing unit, and used to suitably bond them. The multi-layered thermally conductive sheet of the present embodiment has a thickness of preferably 1 mm or less, more preferably 0.8 mm or less, furthermore preferably 0.6 mm or less, so as to cope with the development in miniaturization and high integration of electronics. Incidentally, the thickness may be 0.2 mm or more from the viewpoint of practical manufacturability and handleability.

"UL-94 flammability test" is hereinbelow described. First, specimens having the size of 13 mm×125 mm are prepared for thermally conductive sheets to be tested. Each specimen is suspended vertically by holding with a holding clamp at one longitudinal end thereof. Cotton is disposed at the place 30 cm below the specimen. Then, a burner flame is applied to the other longitudinal end (free end portion) of the specimen for 10 seconds (first application). After the flame spread to the specimen ceases, the burner flame is further applied for 10 seconds (second application). Taking the first application and the second application for 5 specimens as one set, two sets of the test are carried out for the thermally conductive sheets. Each of the specimens is measured for the following (1) to (5), and the evaluations for the measurements are given.
(1) Duration of flaming combustion of the specimen after the first application
(2) Duration of flaming combustion of the specimen after the second application
(3) Duration of glowing-combustion after the second application
(4) Whether or not flaming drips ignite cotton disposed below the specimen
(5) Whether or not the specimen burns up to the holding clamp When all the following conditions (i) to (v) are satisfied as a result of the measurement/evaluation on the above (1) to (5), the thermal conductive sheet can be evaluated as the one having flame retardancy corresponding "V-0".
(i) The total flaming combustion time per each specimen is 10 seconds or less.
(ii) The total flaming combustion time of all the specimens in each set is 50 seconds or less.
(iii) The total of the flaming combustion time and the glowing combustion time of each specimen after the second application is 30 seconds or less.
(iv) The cotton is not ignited by the flaming drip.
(v) For all the specimens, the glowing or the flaming combustion does not reach the holding clamp.

EXAMPLE

The present invention is hereinbelow described specifically on the basis of Examples. However, the present invention is by no means limited to the Examples.

Preparation of the First and the Second Compositions

The components shown in Table 1 were put in the planetary mixer altogether and deaerated and kneaded for 30 minutes to obtain compositions of No. 1 to 9. Incidentally, among the components used, regarding aluminum hydroxide (commercial name: H34 produced by SHOWA DENKO K.K.), Table 2 shows percentages by volume of aluminum hydroxide contained in the compositions.

Example 1

Then, the composition No. 1 was held by two ultraviolet transmitting polyethylene terephthalate liners (PET liners) treated with silicone, and the composition was subjected to calendering to give a sheet having a thickness of 0.14 mm (excluding the thickness of the PET liners). In this state, ultraviolet radiation was irradiated at an intensity of 0.5 mW/cm$^2$ for 10 minutes with a low pressure mercury lamp from both sides through the liners to obtain an acrylic thermally conductive sheet layer having a thickness of 0.15 mm (first acrylic thermally conductive sheet layer (first layer)) which was held between two the PET liners. One of the PET liners was peeled to expose the first acrylic thermally conductive sheet layer (first layer)). The first acrylic thermally conductive sheet layer (first layer) had an Asker C hardness of 80, which was measured by the method described later.

Then, the composition No. 2 was held between a PET liner treated with silicone and the above first acrylic thermally conductive sheet layer (first layer), and the composition was subjected to calendering to give a multi-layer sheet having a total thickness of 0.46 mm (excluding the thickness of the PET liners). In this state, ultraviolet radiation was irradiated at an intensity of 2.0 mW/cm$^2$ for 10 minutes with a low pressure mercury lamp from both sides through the liners to form an acrylic thermally conductive sheet layer (second acrylic thermally conductive sheet layer (second layer)) to obtain a multi-layered thermally conductive sheet having a thickness of 0.5 mm (Example 1) which was held between two PET liners. Incidentally, the second acrylic thermally conductive sheet layer (second layer) had an Asker C hardness of 25.

Example 2

An acrylic thermally conductive sheet layer (first layer) having a thickness of 0.15 mm and held between two PET liners was obtained in the same manner as in Example 1 except that the composition No. 3 was used. Then, the composition No. 2 was held between a PET liner treated with silicone and the above first layer, and the composite was subjected to calendering to give a multi-layer sheet having a thickness of 0.46 mm (excluding the thickness of the PET liners). In this state, ultraviolet radiation was irradiated at an intensity of 4.5 mW/cm$^2$ for 10 minutes with a low pressure mercury lamp from both sides through the liners to obtain a multi-layered thermally conductive sheet having a thickness of 0.5 mm (Example 2) which was held between two PET liners. Incidentally, the first layer comprising the composition No. 3 and the second layer comprising the composition No. 2 had an Asker C hardness of 20 and 66, respectively.

Example 3

The composition No. 4 was held between a PET liner treated with silicone and the above first layer comprising the composition No. 1 and obtained in Example 1, and the composition was subjected to calendering to give a multi-layer sheet having a thickness of 0.74 mm (excluding the thickness of the PET liners). In this state, ultraviolet radiation was irradiated at a strength of 4.5 mW/cm$^2$ for 10 minutes with a low pressure mercury lamp from both sides through the liners to obtain a multi-layered thermally conductive sheet having a thickness of 0.8 mm (Example 3) which is and held between two PET liners. Incidentally, the second layer comprising the composition No. 4 had an Asker C hardness of 15.

Example 4

The composition No. 5 was held between a PET liner treated with silicone and the above first layer comprising the composition No. 1 and obtained in Example 1, and the composition was subjected to calendering to give a multi-layer sheet having a thickness of 0.74 mm (excluding the thickness of the PET liner). The obtained molded sheet was heated at 140° C. for 15 minutes in an oven to obtain a multi-layered thermally conductive sheet having a thickness of 0.8 mm (Example 4) which was held between two PET liners. Incidentally, the second layer comprising the composition No. 5 had an Asker C hardness of 37.

Example 5

An acrylic thermally conductive sheet layer (first layer) having a thickness of 0.15 mm and held between two PET liners was obtained in the same manner as in Example 1 except that the composition No. 6 was used. Then, the composition No. 7 was held between a PET liner treated with silicone and the above first layer, and the composition was subjected to calendering to give a sheet having a thickness of 0.92 mm (excluding the thickness of the PET liners). The obtained molded sheet was heated at 140° C. for 15 minutes with an oven to obtain a multi-layered thermally conductive sheet having a thickness of 1.0 mm (Example 5) which was held between two PET liners. Incidentally, the first layer comprising the composition No. 6 and the second layer comprising the composition No. 7 had an Asker C hardness of 78 and 29, respectively.

Example 6

The composition No. 4 was held by two PET liners treated with silicone, and the composition was subjected to calendering to give a sheet having a thickness of 0.46 mm (excluding the thickness of the PET liners). In this state, ultraviolet radiation was irradiated at a strength of 4.5 mW/cm$^2$ for 10 minutes with a low pressure mercury lamp from both sides through the liners to obtain the second layer having a thickness of 0.5 mm which was held between two PET liners. Incidentally, the second layer comprising the composition No. 4 had an Asker C hardness of 12. Further, the second layer comprising the composition No. 4 was superposed on the multi-layered thermally conductive sheet obtained in Example 1 in such a manner that the second layer is brought into contact with the surface on the side of the first layer (i.e., layer of high hardness) comprising the composition No. 1, followed by a lamination treatment to obtain a multi-layered thermally conductive sheet having a thickness of 1.0 mm (excluding the thickness of the PET liners) (Example 6).

Comparative Example 1

The composition No. 1 was held by two PET liners treated with silicone, and the composition was subjected to calendering to give a sheet having a thickness of 0.46 mm (excluding the thickness of the PET liners). In this state, ultraviolet radiation was irradiated at an intensity of 0.5 mW/cm$^2$ for 10 minutes with a low pressure mercury lamp from both sides through the liners to obtain a thermally conductive sheet having a thickness of 0.5 mm and an Asker hardness of 88, which was held between two PET liners.

Comparative Example 2

There was obtained a thermally conductive sheet having a thickness of 0.5 mm and an Asker hardness of 39 (Comparative Example 2), which was held between two PET liners in the same manner as in the above Comparative Example 1 except that the composition No. 2 was used in place of the composition No. 1.

Comparative Example 3

The first layer having a thickness of 0.15 mm and held between two PET liners was obtained in the same manner as in Example 1 except that the composition No. 8 was used. Then, the composition No. 2 was held between a PET liner treated with silicone and the above first layer, and the composition was subjected to calendering to give a sheet having a thickness of 0.46 mm (excluding the thickness of the PET liners). In this state, ultraviolet radiation was irradiated at an intensity of 0.5 mW/cm$^2$ for 10 minutes with a low pressure mercury lamp from both sides through the liners to obtain a multi-layered thermally conductive sheet having a thickness of 0.5 mm (Comparative Example 3) which was held between two PET liners. Incidentally, the first layer comprising the composition No. 8 and the second layer comprising the composition No. 2 had an Asker C hardness of 39 and 53, respectively.

Comparative Example 4

The first layer having a thickness of 0.15 mm and held between two PET liners was obtained in the same manner as in Example 1 except that the composition No. 9 was used. Then, the composition No. 2 was held between a PET liner treated with silicone and the above first layer, and the composition was subjected to calendering to give a sheet having a thickness of 0.74 mm (excluding the thickness of the PET liners). In this state, ultraviolet radiation was irradiated at a strength of 0.5 mW/cm$^2$ for 10 minutes with a low pressure mercury lamp from both sides through the liners to obtain a multi-layered thermally conductive sheet having a thickness of 0.8 mm (Comparative Example 4) which was held between two PET liners. Incidentally, the first layer comprising the composition No. 9 and the second layer comprising the composition No. 2 had an Asker C hardness of 84 and 46, respectively.

Comparative Example 5

The composition No. 7 was held by two PET liners treated with silicone, and the composition was subjected to calendering to give a sheet having a thickness of 0.92 mm (excluding the thickness of the PET liners). The obtained molded sheet was heated at 140° C. for 15 minutes with an oven to obtain a thermally conductive sheet having a thickness of 1.0 mm and an Asker C hardness of 29 (Comparative Example 5) which was held between two PET liners.

TABLE 1

| Component | Composition (part by weight) | | | | | | | | |
|---|---|---|---|---|---|---|---|---|---|
| | No. 1 | No. 2 | No. 3 | No. 4 | No. 5 | No. 6 | No. 7 | No. 8 | No. 9 |
| 2-ethylhexyl acrylate | 100 | 100 | 100 | 100 | 100 | 100 | 100 | 100 | 100 |
| 1,6-hexanedioldiacrylate (crosslinking agent) | — | — | — | 0.15 | 0.25 | — | 0.25 | — | — |
| triallylisocyanurate (crosslinking agent) | 10 | 1.2 | 3 | — | — | 10 | — | 1.5 | 10 |
| tricresyl phosphate | 20 | 10 | 20 | 20 | 30 | 30 | 40 | 20 | — |
| tetraethyleneglycol-di-2-ethylhexonate (plasticizer) | 10 | 30 | 10 | 20 | — | — | 10 | 10 | 20 |
| Irganox1076*[1] (antioxidant) | 0.3 | 0.3 | 0.3 | 0.3 | 0.3 | 0.3 | 0.3 | 0.3 | 0.3 |
| Irgacure651*[2] (photopolymerization initiator) | 0.4 | 0.4 | 0.4 | 0.4 | — | 0.4 | — | 0.4 | 0.4 |
| PERHEXA TMH*[3] (thermal polymerization initiator) | — | — | — | — | 0.6 | — | 0.6 | — | — |
| Titacoat S-151*[4] (titanate-based coupling agent) | 2 | 2 | 2 | 2 | 4 | 4 | 5 | 2 | 4 |
| CP240*[5] (silicon carbide) | 5 | 40 | 5 | 40 | — | — | — | 5 | 5 |
| H34*[6] (aluminum hydroxyde) | 480 | 440 | 480 | 440 | 200 | 300 | 200 | 480 | 50 |
| DAM45*[7] (alumina) | — | — | — | — | 780 | 450 | 1120 | — | 1000 |
| AKP 15*[8] (alumina) | — | — | — | — | — | — | 100 | — | — |

*[1,2]Commercial name (produced by Ciba Specialty Chemicals K.K.)
*[3]Commercial name (produced by NOF Corp.)
*[4]Commercial name (produced by Nippon Soda Co., Ltd.)
*[5]Commercial name (produced by Nanko Abrasives Industry Co., Ltd.)
*[6]Commercial name (produced by SHOWA DENKO K.K.)
*[7]Commercial name (produced by DENKI KAGAKU KOUGYO KABUSHIKI KAISHA)
*[8]Commercial name (produced by Sumitomo Chemical Co., Ltd.)

TABLE 2

| Component | Amount of aluminum hydroxide (% by volume) in composition | | | | | | | | |
|---|---|---|---|---|---|---|---|---|---|
| | No. 1 | No. 2 | No. 3 | No. 4 | No. 5 | No. 6 | No. 7 | No. 8 | No. 9 |
| H34*[1] (aluminum hydroxide) | 44 | 53 | 58 | 53 | 20 | 32 | 15 | 58 | 4 |

*[1]Commercial name (produced by SHOWA DENKO K.K.)

Each of the thermally conductive sheets obtained in Examples 1 to 6 and Comparative Examples 1 to 5 was measured for flame retardancy, hardness, compressive stress, coefficient of thermal conductivity, and handleability; and the evaluations were given. The results are shown in Table 3. Incidentally, methods of the measurements/evaluations are hereinbelow described.

Flammability (UL-94 Flammability Test)

Flame retardancy was evaluated in accordance with UL Flameproof Test Standard UL-94 "flammability test of plastic materials for devices and electronic parts".

Hardness (Asker C)

A sample for the hardness test was prepared by laminating thermally conductive sheets to be tested so that the sample may have a thickness of 10 mm or a minimum thickness above 10 mm. The sample was measured for hardness under a load of 1 kg with an Asker C hardness meter. Incidentally, regarding the second acrylic thermally conductive sheet layer (low hardness layer) of the multi-layered conductive sheet in each Example, a sample for measuring hardness was obtained by slicing off the first acrylic thermally conductive sheet layer (high hardness layer).

Compressive Stress (N/cm$^2$)

A thermally conductive sheet having the size of 25 mm×25 mm was measured, as compressive stress, a peak pressure when the initial thickness is reduced by 20% by compression at a speed of 5 mm/min. with a precision universal tester (commercial name: Autograph produced by Shimadzu Corporation).

Coefficient of Thermal Conductivity (W/(m·K))

A piece having a size of 0.01 m×0.01 m (Area to be measured: 1.0×10$^{-4}$ m$^2$) was cut out of a thermally conductive sheet (having a thickness of L(m)) to be tested. The piece was held between an exothermic plate and a cooling plate and measured for temperature difference (K) between the heating plate and the cooling plate after being maintained for 5 minutes with applying an electric power of 4.8 W under a load of 7.6×10$^4$ N/m$^2$ to obtain the thermal resistance $R_L$ (K·m$^2$/W) by the following formula:

$R_L$(K·m$^2$/W)=temperature difference (K)×measured area (m$^2$)/electric power (W)

Further, a sample having a thickness of 2 L (m) was obtained by laminating two pieces having the same size as the above piece and cut out of the same sheet. The sample was measured for thermal resistance $R_{2L}$ (K·m$^2$/W) in the same manner as described above. The coefficient of the thermal conductivity λ(W/(m·K)) was obtained by the following formula with the $R_L$ and $R_{2L}$ values obtained above.

λ(W/(m·K))=L(m)/($R_{2L}$(K·m$^2$/W)−$R_L$(K·m$^2$/W))

Handleability

A thermally conductive sheet held between two PET liners was cut to have a size of 20 mm×100 mm together with the PET liners to obtain a sample for evaluation. Before and after the PET liners on both surfaces of the sheet were peeled off, the thermally conductive sheet was measured for the size to check whether or not deformation occurred (change in size). The standard of the evaluation is shown below. Incidentally, the smaller the deformation (change in size) is, the higher the handleability is.

| Good: | No deformation (or deformed but restored) |
|---|---|
| Bad: | Deformation (not restored) |

TABLE 3

| | Thickness of sheet (mm) | First composition/ hardness (Asker C) | Second composition/ hardness (Asker C) | flame retardancy (UL-94 flammability test) | Compressive stress (N/cm$^2$) | Coefficient of thermal conductivity (W/(m · K)) | Handle-ability |
|---|---|---|---|---|---|---|---|
| Example 1 | 0.5 | No. 1/80 | No. 2/25 | V-0 | 57 | 2.2 | good |
| Example 2 | 0.5 | No. 3/66 | No. 2/20 | V-0 | 50 | 2.3 | good |
| Example 3 | 0.8 | No. 1/80 | No. 4/15 | V-0 | 68 | 2.4 | good |
| Example 4 | 0.8 | No. 1/80 | No. 5/37 | V-0 | 61 | 3.5 | good |
| Example 5 | 1.0 | No. 6/78 | No. 7/29 | V-0 | 98 | 6.8 | good |
| Example 6 | 1.0 | No. 1/80 | No. 2/25, No. 4/12 | V-0 | 70 | 2.4 | good |
| Comp. Ex. 1 | 0.5 | No. 1/80 | — | V-0 | 126 | 1.8 | good |
| Comp. Ex. 2 | 0.5 | No. 2/39 | — | Flame drip*[1] | 51 | 2.4 | bad |
| Comp. Ex. 3 | 0.8 | No. 8/53 | No. 2/39 | Flame drip*[1] | 60 | 2.5 | bad |
| Comp. Ex. 4 | 0.8 | No. 9/84 | No. 2/46 | Flammable*[2] | 66 | 2.7 | bad |
| Comp. Ex. 5 | 1.0 | No. 7/29 | — | Flame drip*[1] | 92 | 7.5 | good |

*[1]flame drips ignited cotton.
*[2]the specimen burned up to the holding clamp.

As shown in Table 3, all the multi-layered thermally conductive sheets of Examples 1 to 6 showed flame retardancy corresponding to V-0 though the sheets had a thickness of 1 mm or less. On the other hand, only Comparative Example 1 among Comparative Examples 1 to 5 showed flame retardancy corresponding to V-0, and no other Comparative Example showed flame retardancy corresponding to V-0. Incidentally, it was found out that Comparative Example 1 has remarkably large compressive stress and inferior flexibility in comparison with Examples 1 and 2, which have the same thickness as Comparative Example 1. In addition, it is obvious that multi-layered thermally conductive sheets of the other Examples have about the same compressive stress and flexibility as Comparative Examples. Therefore, the multi-layered thermally conductive sheets of the Examples have flame retardancy corresponding to V-0 without having impaired flexibility, and it is expected that the multi-layered thermally conductive sheets of the Examples exhibit superior adhesion between objects on which the sheet is disposed. Further, the multi-layered thermally conductive sheets of the Examples are excellent in handleability and have sufficient thermal conductivity.

A multi-layered thermally conductive sheet of the present invention has superior thermal conductivity and flame retardancy as well as superior handleability and adhesion even without using any of a halogen-containing flame retardant, red phosphorous, and silicone resin. Therefore, a multi-layered thermally conductive sheet of the present invention is suitable as a thermally conductive sheet to be used in such a state that the sheet is disposed between a heat release body such a heat sink and heat generating parts such as electronics and electronic parts including an integrated circuit (IC).

We claim:

1. A multi-layered thermally conductive sheet comprising:
    a first cross-linked acrylic thermally conductive sheet layer, and
    a second cross-linked acrylic thermally conductive sheet layer disposed on one or both surfaces of the first acrylic thermally conductive sheet layer;
    the first cross-linked acrylic thermally conductive sheet layer having an Asker C hardness of 60 or more,
    the first crosslinked acrylic thermally conductive sheet layer being obtained by cross-linking a cross-likable acrylic composition containing 10% by volume or more of a metal hydrate,
    the second cross-linked acrylic thermally conductive sheet layer having an Asker C hardness of 50 or less,
    the second cross-linked acrylic thermally conductive sheet layer being obtained by cross-linking a cross-linkable acrylic composition containing 5% by volume or more of a metal hydrate, and
    the first cross-linked acrylic thermally conductive sheet layer having half or less thickness with respect to thickness of the whole sheet.

2. The multi-layered thermally conductive sheet according to claim 1, wherein
    the first cross-linked acrylic thermally conductive sheet layer is obtained by cross-linking the cross-likable acrylic composition containing: 100 parts by weight of a monofunctional (meth)acrylic monomer; and 150 parts by weight or more of a metal hydrate; further containing 0.1 to 5 parts by weight of a polyfunctional (meth)acrylic monomer and/or 0.5 to 20 parts by weight of a triazine skeleton-containing compound copolymerizable with the monofunctional (meth)acrylic monomer and the polyfunctional (meth)acrylic monomer, and
    the second cross-linked acrylic thermally conductive sheet layer is obtained by cross-linking the cross-likable acrylic composition containing: 100 parts by weight of the monofunctional (meth)acrylic monomer; and 50 parts by weight or more of the metal hydrate; further containing 0.05 to 1.5 parts by weight of the polyfunctional (meth)acrylic monomer and/or 0.1 to 5 parts by weight of the triazine skeleton-containing compound.

3. The multi-layered thermally conductive sheet according to claim 1, wherein the sheet has a thermal conductivity of 1 W/(m·K) or more.

4. The multi-layered thermally conductive sheet according to claim 1, wherein the sheet has a flame retardancy corresponding to V-0 in the flammability test based on UL Flameproof Test Standard UL-94 (Underwriters Laboratories, Inc. Standard No. 94).

5. The multi-layered thermally conductive sheet according to claim 1, wherein the sheet has a whole thickness of 1 mm or less.

* * * * *

UNITED STATES PATENT AND TRADEMARK OFFICE
CERTIFICATE OF CORRECTION

PATENT NO.       : 7,709,098 B2                                              Page 1 of 1
APPLICATION NO.  : 11/568237
DATED            : May 4, 2010
INVENTOR(S)      : Masaki Yoda It is certified that error appears in the above-identified patent and that said Letters Patent is hereby corrected as shown below:

Column 21
Line 39, delete "cross-likable" and insert --cross-linkable--

Column 22
Line 13, delete "cross-likable" and insert --cross-linkable--
Line 23, delete "cross-likable" and insert --cross-linkable--

Signed and Sealed this
Fifth Day of April, 2011

David J. Kappos
*Director of the United States Patent and Trademark Office*